(12) United States Patent
Kunemund et al.

(10) Patent No.: US 7,323,910 B2
(45) Date of Patent: Jan. 29, 2008

(54) CIRCUIT ARRANGEMENT AND METHOD FOR PRODUCING A DUAL-RAIL SIGNAL

(75) Inventors: Thomas Kunemund, Munich (DE); Holger Sedlak, Sauerlach (DE)

(73) Assignee: Infineon Technologies Ag, Neubiberg (DE)

( * ) Notice: Subject to any disclaimer, the term of this patent is extended or adjusted under 35 U.S.C. 154(b) by 631 days.

(21) Appl. No.: 10/965,663

(22) Filed: Oct. 14, 2004

(65) Prior Publication Data
US 2005/0063478 A1    Mar. 24, 2005

Related U.S. Application Data

(63) Continuation of application No. PCT/DE2003/001059, filed on Apr. 1, 2003.

(30) Foreign Application Priority Data
Apr. 18, 2002    (DE) ................ 102 17 375

(51) Int. Cl.
  *H03K 19/096*   (2006.01)
  *H03K 19/00*    (2006.01)
(52) U.S. Cl. .................. 326/98; 326/93; 326/97
(58) Field of Classification Search .......... 326/93, 326/95–98
See application file for complete search history.

(56) References Cited

U.S. PATENT DOCUMENTS

| 4,570,084 | A | | 2/1986 | Griffin et al. |
| 5,550,487 | A | * | 8/1996 | Lyon ..................... 326/33 |
| 5,815,005 | A | * | 9/1998 | Bosshart ................ 326/95 |
| 5,859,548 | A | * | 1/1999 | Kong .................... 326/113 |
| 5,966,382 | A | | 10/1999 | Fawal et al. |

(Continued)

FOREIGN PATENT DOCUMENTS

EP    0 334 050 A2    2/1989

(Continued)

OTHER PUBLICATIONS

Hong-Yi Huang et al.; "New CMOS Differential Logic Circuits for True-Single-Phase Pipelined Systems"; Circuits and Systems, 1994, pp. 15-18, month n/a.

(Continued)

*Primary Examiner*—Rexford Barnie
*Assistant Examiner*—Jason Crawford
(74) *Attorney, Agent, or Firm*—Dickstein, Shapiro, LLP.

(57) ABSTRACT

Circuit arrangement for producing a dual-rail output signal having a signal processing apparatus with two switches, which are driven as a function of an input signal, a first output connected via one of the switches to a signal processing apparatus foot point, which is at a first potential, and a second output connected via the other switch to the foot point. The signal processing apparatus is connected via a switching apparatus to outputs of the circuit arrangement in order to output a dual-rail output signal. The outputs of the switching apparatus are each connected to one or to both inputs of the switching apparatus as a function of a control signal. A potential monitoring apparatus defines the potentials at the outputs of the circuit arrangement when these outputs are not connected via the switching apparatus and the signal processing apparatus to the foot point of the signal processing apparatus.

6 Claims, 5 Drawing Sheets

U.S. PATENT DOCUMENTS

| | | | |
|---|---|---|---|
| 6,069,497 A | | 5/2000 | Blomgren et al. |
| 6,331,791 B1 * | | 12/2001 | Huang .................... 326/98 |
| 6,374,393 B1 | | 4/2002 | Hirairi |
| 6,459,316 B1 * | | 10/2002 | Vangal et al. ............ 327/202 |
| 6,466,057 B1 * | | 10/2002 | Naffziger ................. 326/121 |
| 6,570,409 B2 * | | 5/2003 | Ananthanarayanan et al. ..................... 326/115 |
| 6,686,776 B2 * | | 2/2004 | Sakata et al. .............. 326/95 |
| 6,828,909 B2 * | | 12/2004 | Script et al. ........... 340/545.1 |

FOREIGN PATENT DOCUMENTS

| | | |
|---|---|---|
| EP | 0 440 514 A2 | 8/1991 |
| EP | 1 126 611 A1 | 8/2001 |
| EP | 1 168 625 A2 | 1/2002 |
| JP | 60-114029 | 6/1985 |
| JP | 61-264820 | 11/1986 |
| JP | 61-264820 A | 11/1986 |
| JP | 05-175827 | 7/1993 |
| JP | 60-061842 | 3/1994 |
| JP | 10117140 | 5/1998 |
| SU | 1008909 A | 3/1983 |
| WO | WO 01/63767 A2 | 8/2001 |

OTHER PUBLICATIONS

Chun-Keung Lo et al; "Design of Low Power Differential Logic Using Adiabatic Switching Technique"; Circuits and Systems, 1998, pp. 33-36, March.

Kazuo Yano et al; "A 3.8-ns CMOS 16×16-b Multiplier Using Complementary Pass-Transistor Logic"; IEEE Journal of Solid-State Circuits, Apr. 1990, vol. 25, No. 2, New York, US, pp. 388-395.

Fang-shi Lai et al.; "Design and Implementation of Differential Cascode Voltage Switch with Pass-Gate (DCVSPG) Logic for High-Performance Digital Systems"; IEEE Journal of Solid-State Circuits, vol. 32, No. 4, Apr. 1997, New York, US, pp. 563-573.

"Asymmetric Transition Dual-Rail Signalling"; IBM Technical Disclosure Bulletin, vol. 37, No. 1, New York, US, pp. 69-84, Jan. 1994.

Russian Notice of Allowance dated Apr. 20, 2006.

* cited by examiner

CIRCUIT ARRANGEMENT AND METHOD FOR PRODUCING A DUAL-RAIL SIGNAL

CROSS-REFERENCE TO RELATED APPLICATION

This application is a continuation of International Patent Application Serial No. PCT/DE2003/001059, filed Apr. 1, 2003, which published in German on Oct. 23, 2003 as WO 2003/088488 A3 and is incorporated herein by reference in its entirety.

FIELD OF THE INVENTION

The present invention relates to a circuit arrangement and method for producing a dual-rail output signal.

BACKGROUND OF THE INVENTION

Switching networks are normally designed microelectronically such that each bit of the information to be processed is physically represented by one, and only one, electrical node. A configuration such as this is also referred to as "single-rail" circuit technology. Switching networks such as these are, however, relatively uncertain with regard to so-called differential current profile analysis, which is used by unauthorized third parties when attempting to gain access to secret information. Differential current profile analysis, which is also referred to as differential power analysis—DPA—, is one of the most important methods, for example, for attacking smart cards for security purposes. This involves deliberate attacks on confidential information (passwords or cryptographic keys). For a given program or a given algorithm, smart card current profiles which are measured by means of statistical methods, and/or their charge integrals calculated over one or more clock cycles, are evaluated, in which case—for a large number of program runs—it is possible to draw conclusions about the information to be protected from the correlation between the systematic data variation and the respective charge integral.

In contrast to conventional single-rail circuit technology, in which each bit within a data path or signal path is physically represented by one, and only one, electrical node k, an implementation using dual-rail circuit technology results in each bit being represented by two nodes k and kq, with this bit having a valid logic value when k corresponds to the true logic value b of this bit, and kq corresponds to the negated value bn=not (b).

Thus, when the value b=1 is intended to be transmitted, this is done by means of a "1" in the node k. At the same time, however, the value "0" is transmitted at the node kq, so that, overall, both a "1" and a "0" are thus transmitted. When the value b=0 is to be transmitted, the value "1" is at the same time transmitted at the node kq. A "1" and a "0" are thus transmitted in both cases. Assuming that the nodes k and kq are physically identical, it is now no longer possible to use differential current profile analysis to identify whether a "1" or a "0" is being transmitted as the data item. However, this is true only when a signal change actually takes place for each transmitted data item, that is to say when the information "1" and the information "0" alternate. If a number of identical data items are transmitted successively, the characteristics with regard to the capability for attacks by means of differential current profile analysis deteriorate.

The desired invariance of the charge integrals is now achieved by inserting a so-called precharge state, also referred to just as precharge, between in each case two states with valid logic values (b, bn)=(1, 0) or (0, 1), for which both k and kq are charged to the same electrical potential, that is to say they assume logically invalid values (1, 1) or (0, 0). A state sequence for the precharge state (1, 1) could thus appear as follows:

(1, 1)→(0, 1)→(1, 1)→(1, 0)→(1, 1)→(1, 0)→(1, 1)→(0, 1)→ . . .

It can be said for any such character sequences that the charge on one, and only one, node is changed from "1" to "0" for each transition from (1, 1)→(b, bn), and that one, and only one, node is changed from "0" to "1" for all (b, bn)→(1, 1), irrespective of the logically valid value b of the status bit in question. An analogous situation applies to state sequences with the precharge state (0, 0).

It follows from this that the charge integrals which correspond to these state sequences are independent of the sequence (b, bn) of the logically valid values, provided that care is taken to ensure that the nodes k and kq have the same electrical capacitances. The current profile of a data path implemented in this way is thus independent of time variations in the data to be processed, and is thus resistant to differential current profile analysis.

Circuit arrangements for producing a dual-rail signal are used, for example, in a data processing apparatus such as that shown in FIG. 1. This shows a data processing apparatus 3 which has an arithmetic and logic unit 2 (ALU). An ALU such as this is provided for linking two input values to one another, for example by carrying out an addition process. Two input values a and b are thus linked to form an output value c. A subtraction process can be carried out by supplying one of the two values that are to be linked in inverted form to the ALU, and by at the same time setting a carry bit at the carry-in input of the ALU. In the example in FIG. 1, the signal not (a) is required instead of the signal a. To do this, the data processing apparatus 3 has preprocessing input circuits 1, which are suitable for producing the function not (a).

The input circuit 1 produces an output signal Z, which is transmitted to the ALU. In other situations, the value "0" or the value "1" is required as the input value for the ALU, so that the input circuit 1 therefore also has to have the capability to provide these two values. The required output functions z of the input circuit 1 are thus:

Z=f(a),

Z=not (f(a)),

Z=0 and

Z=1

The function f in this case indicates that the input data a may be processed further, for example if the data a is scrambled and is first of all intended to be descrambled in order to allow further processing in the ALU. The control signals S0, S1, which are supplied to the input circuit 1, determine which of these four functions should be implemented.

In addition to the signal paths for the signals a, b, z and c, which are shown by bold lines in FIG. 1, signal paths for signals aq, bq, zq and cq are shown by finer lines. These signal paths, or these signals, are present when this is a data processing apparatus 3 which is suitable for processing dual-rail signals. The complementary signal is still always present in addition to the actual data signal, provided that this is a valid data item. In the precharge state mentioned above, the same signal is carried on both signal lines, that is to say a=aq, b=bq, z=aq and c=cq.

The function which is to be provided by the input circuit 1, in conjunction with the two control bits S0 and S1, is thus:

$$z=\text{not}(s1\cdot\text{not}(f(a<n:1>)=s0\cdot f(a<n:1>)).$$

According to the prior art, a function such as this is implemented by a circuit arrangement such as that illustrated in FIG. 2. A data word a<n:1> with a length of n bits is supplied to a first circuit unit 4, which forms the function f(a). This signal is additionally inverted, so that both f(a) and not (f(a)) are available for further processing. f(a) is then linked to the control bit S0 in an AND circuit. The value not(f(a)) is likewise linked to the control bit S1 in an AND circuit. The output values from the two AND gates are linked in an OR circuit in order to form the output value z.

A number of series-connected conventional gates are thus used. Such a circuit arrangement which follows the logical system is relatively complex in terms of the number of transistors that need to be used, particularly when a dual-rail signal is intended to be used rather than a single-rail signal. Furthermore, the processing time in circuit arrangements such as these, which also draw a large amount of current, is comparatively long.

As can be seen from the application illustrated in FIG. 1, a circuit such as this occurs not just once in a data processing apparatus, but must be provided separately for each bit that is to be processed in parallel. The circuit must therefore be included 2×32=64 times for a processor operating with a bus width of 32 bits.

SUMMARY OF THE INVENTION

An object of the invention is thus to specify a circuit arrangement for producing a dual-rail output signal, whose design is simpler and can be implemented using fewer transistors. A further object is to specify a corresponding method.

This object is achieved by a circuit arrangement for producing a dual-rail output signal having a first input with at least two connections for receiving a dual-rail input signal, a second input for receiving a control signal, a signal processing apparatus with a first switch and a second switch, which can each be driven as a function of the input signal, as well as two outputs, in which case the first output can be connected by means of one of the switches to a foot point, which is at a first potential, of the control apparatus, and the second output can be connected by means of the other switch to said foot point of the control apparatus, having a switching apparatus, having two inputs which are connected to the outputs of the signal processing apparatus, and having two outputs which are connected to two outputs of the circuit arrangement in order to output a dual-rail output signal, in which case the outputs can each be connected to one or to both inputs as a function of a control signal, and having a potential monitoring apparatus for defining the potentials at the outputs of the circuit arrangement when these are not connected via the switching apparatus and the signal processing apparatus to the foot point of the signal processing apparatus.

An advantage of the circuit arrangement according to the invention is that the output can assume not only the values f(a) and fq=not (f(a)), but can also assume the two values "0" and "1". In this case, the circuit is physically very simple and does not have a large number of transistors. In addition to the transistors which are responsible for carrying out the functions f(a, aq) and fq(a, aq) in the signal processing apparatus, only four transistors are required for the switching apparatus, as well as transistors for the potential monitoring apparatus. In one preferred refinement, the potential monitoring apparatus requires only two transistors.

It is particularly advantageous that virtually the entire circuit can be designed using only one transistor type. This has a positive effect on the current drawn by the circuit, since less current is drawn for charge reversal processes in this case.

One refinement of the circuit arrangement that is particularly advantageous allows the following operating situations, with E1 and E2 being the outputs and D1 and D2 the inputs of the switching apparatus:

E1 connected to D1 and E2 connected to D2: z=not (f(a)),
E1 connected to D2 and E2 connected to D1: z=f(a),
E1 connected to D1 and D2, E2 open: z=0, and
E2 connected to D1 and D2, E1 open: z=1.

In this case, the circuit arrangement has precisely the functionality which is required for use of an input circuit as in the case of the data processing apparatus in FIG. 1.

It is furthermore advantageous for an additional precharge apparatus to be provided, which can produce a predetermined identical potential at all the connections of the output which carry data, before each transmitted data item. This provides particularly good security against differential current profile analysis.

In one advantageous embodiment of the signal processing apparatus, the signal processing apparatus includes an XOR function.

BRIEF DESCRIPTION OF THE DRAWINGS

The invention will be explained in more detail in the following text using an exemplary embodiment. In the figures.

DETAILED DESCRIPTION OF THE PREFERRED MODE OF THE INVENTION

Figure 1:
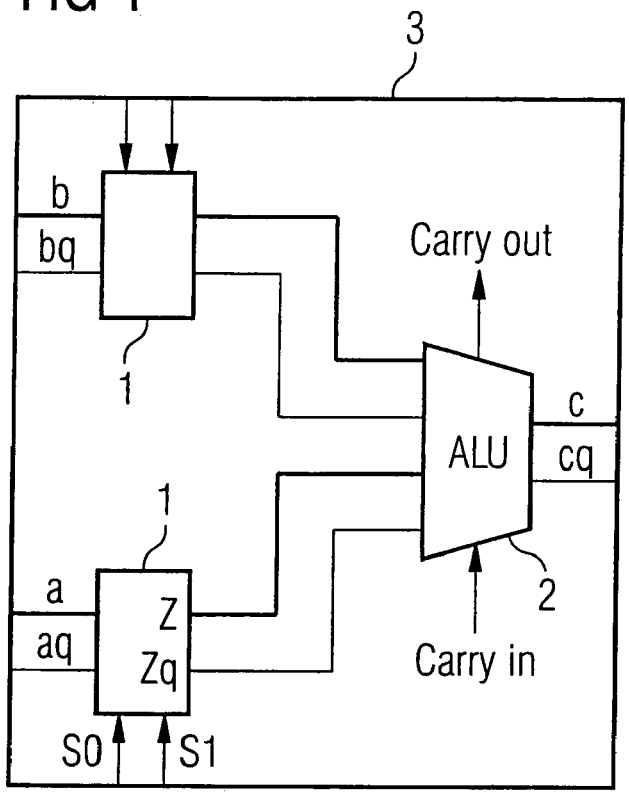
FIG. 1 shows a data processing apparatus in which a circuit arrangement according to the invention can be used.

FIG. 1 shows the data processing apparatus which has already been described in the introduction, and in which a circuit arrangement according to the invention can be used.

Figure 2:
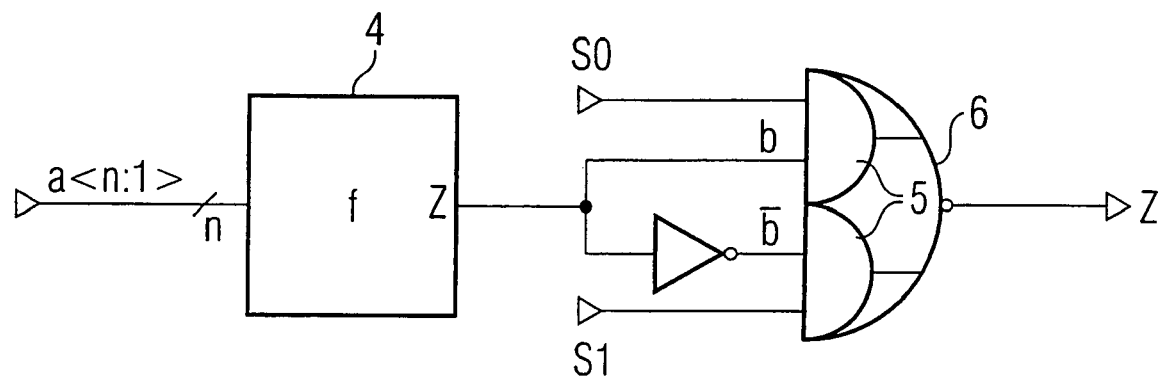
FIG. 2 shows a circuit arrangement according to the prior art.

FIG. 2 shows a circuit arrangement according to the prior art, which has likewise already been described in the introduction.

Figure 3:
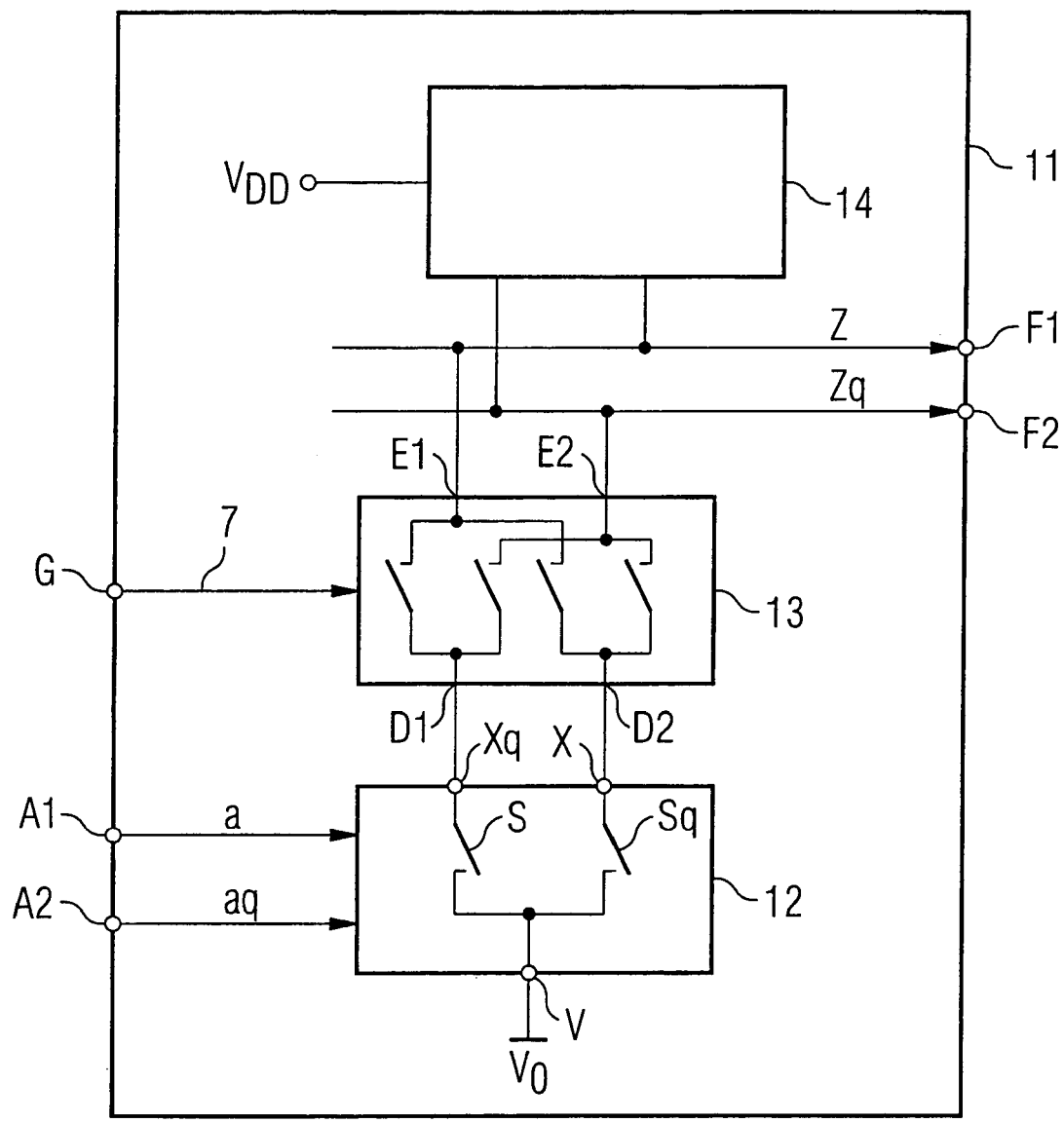
FIG. 3 shows a circuit arrangement according to the invention, illustrated schematically.

FIG. 3 shows a circuit arrangement according to the invention, illustrated schematically. The circuit arrangement 11 has an input A1 and A2, to which a dual-rail signal is fed. The input A1 in this case receives the data signal a, and the input A2 receives the complementary data signal aq. Both signals are supplied to the signal processing apparatus 12. The signal processing apparatus 12 represents the circuitry implementation of two Boolean switch functions, with f' being the so-called "dual-rail" representation of f:

$$s=f(a<n:1>, aq<n:1>) \text{ and}$$

$$sq=fq(a<n:1>, aq<n:1>),$$

and in which case:

$$f(a,aq)=f(a) \text{ if } aq<j>=\text{not}(a<j>) \forall j \text{ and}$$

$$sq=\text{not}(s) \text{ if } aq<j>=\text{not}(a<j>) \forall j.$$

In this case, s=0 and sq=0 means that the respective switch is open and that there is no conductive connection between a foot point v of the signal processing apparatus 12 and the outputs x and xq of the signal processing apparatus 12. In contrast, s=1 and sq=1 means that the foot point v is conductively connected to the respective outputs x and xq.

The outputs x and xq of the signal processing apparatus 12 are connected to inputs D1 and D2 of a switching apparatus 13. Outputs E1 and E2 are connected to outputs F1 and F2 of the entire circuit arrangement, so that an output signal z and zq is produced there, which is a dual-rail signal. Thus, if the data is valid, zq is the complementary signal to z.

Furthermore, a control input G is provided, at which a control signal z is fed in and can be passed to the switching apparatus 13. The control signal 7 determines how the inputs D1 and D2 are connected to the outputs E1 and E2 of the switching apparatus 13.

In order to explain the method of operation, it is first of all assumed that the two outputs F1 and F2 are at the second potential VDD, by means of a potential monitoring apparatus 14. Closing appropriate switches in the signal processing apparatus 12 and in the switching apparatus 13 makes it possible to connect each of the outputs F1 and F2 to the foot point v of the signal processing apparatus which, in the illustration in FIG. 3, is at the first potential V0.

It is now assumed that a valid data signal a, aq is present. This means that either the connection between x and v or that between xq and v is closed, while the other connection is open. This is because the dual-rail signals a and aq are complementary if the data is valid, as described above. This also applies to the switch functions s and sq. It is now possible to use the control signal 7 to ensure that the inputs D1 and D2 and the outputs E1 and E2 of the switching apparatus 13 can be connected to one another as required. If it is first of all assumed that the foot point v of the signal processing apparatus 12 is connected by the switch s to xq, and furthermore that D1 is connected to E1, then F1 is drawn to the first potential V0, since the output F1 is conductively connected to V. The output signal z is accordingly "0".

In accordance with the logic of the dual-rail system, this means that the other output must be at the complementary voltage level, namely at VDD. In a corresponding way, the potential monitoring apparatus 14 connects the output F2 to the second potential VDD in the example just described.

If D2 is also connected to E2, then the signal z, zq now depends only on the switch position of the signal processing apparatus 12. This therefore provides the function z=not (f(a)).

If the function z=f(a) is intended to be provided, then this can be done by connecting D1 to E2 and D2 to E1.

The third function to be provided is z=0. This is provided by connecting E1 to both D1 and D2, while the connection to E2 remains open. One of the outputs x or xq of the signal processing apparatus 12 is always connected to the foot point v. The connection of E1 to both D1 and D2 thus means that the output E1 of the switching apparatus 13 is always connected to the first potential 0 irrespective of the applied data a, aq and of the switch positions s, sq which result from such data, either via the switch s or the switch sq of the signal processing apparatus 12.

The function z=1 can be provided by the output E1 of the switching apparatus 13 remaining open. Without any additional drive, the potential at the output F1 remains at the second potential VDD. In order to produce a valid dual-rail signal, all that is needed is to draw the output F2 to the first potential 0 in order to output the signal zq. To do this, the output E2 is connected both to the input D1 and to the input D2 of the switching apparatus 13. As described, this therefore ensures that the output F2 is connected to the foot point v irrespective of the applied data a, aq.

In one simple embodiment of the potential monitoring apparatus, this apparatus comprises two pull-up resistors, by means of which the outputs F1 and F2 are connected to the second potential VDD. The disadvantage of a solution such as this is that, when one output is connected to the first potential V0, a parallel current flows through the resistor, and this leads to an undesirable current being drawn. This undesirable parallel current also occurs when a transistor connected as a resistor is used.

Thus, in a more advantageous embodiment, two transistors are provided, with in each case one transistor connecting one output to the second potential VDD via its drain-source path. The gate connection is in each case driven by the other output. If these are p-channel transistors, the transistor is thus switched on automatically, as soon as the potential at the output which is connected to the gate becomes 0. This prevents the occurrence of parallel currents.

Figure 4:
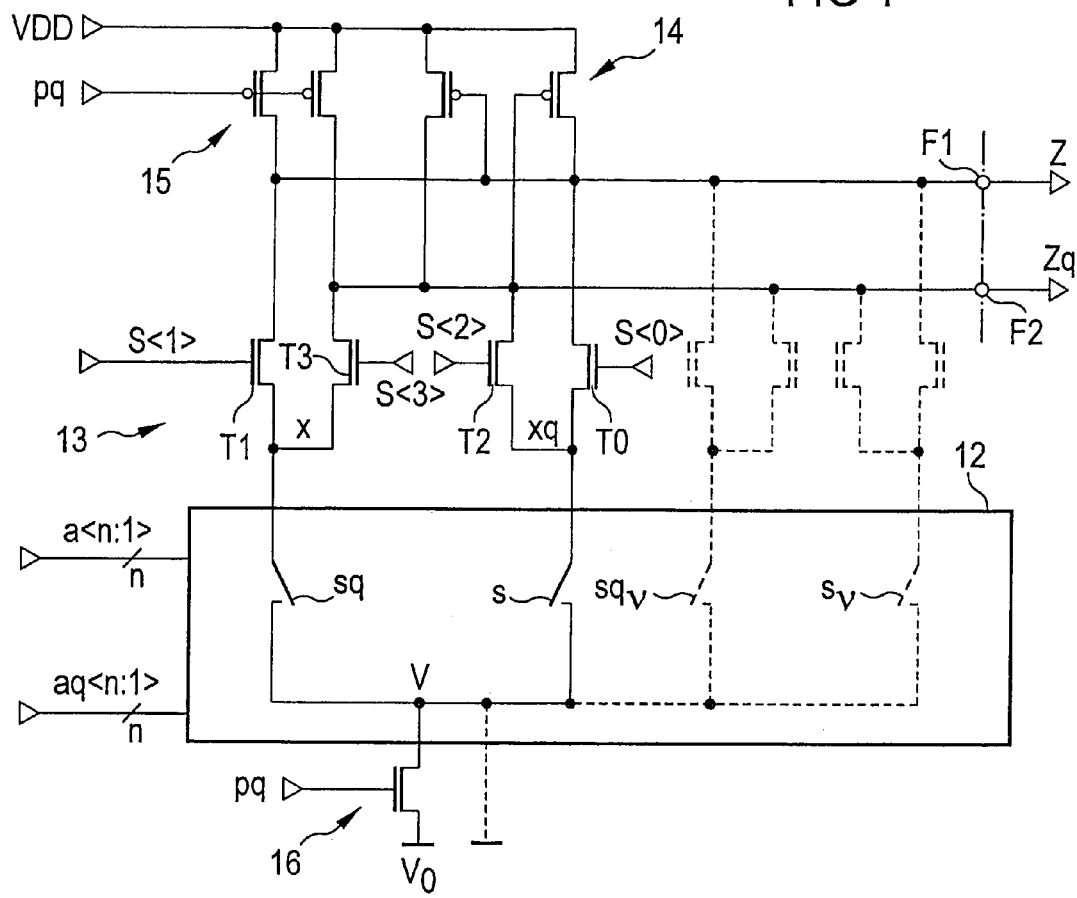
FIG. 4 shows one specific implementation of the circuit arrangement shown in FIG. 2.

FIG. 4 shows a more detailed exemplary embodiment of a circuit arrangement according to the invention. The control signal 7 is formed by the four individual signals s<3>, s<2>, s<1> and s<0>. In addition to the already described arrangement of the transistors in the potential monitoring apparatus 14, two precharge transistors 15 are shown. These connect the second potential VDD to the two outputs F1 and F2. The transistors 15 are driven by a common precharge signal q. When pq=0, the transistors are switched on, and the two outputs F1 and F2 are connected to the second potential VDD.

However, this can lead to problems when the switching apparatus 13 is switched on at the same time and the signal processing apparatus 12 produces a connection to the foot point v, and this is directly connected to the first potential 0. In this case, there is a short circuit between VDD and the potential 0. There are two possible ways to avoid this. One option is to connect the foot point v to the potential 0 via an additional transistor 16, with this transistor 16 likewise being driven by the precharge signal pq. The foot point transistor 16 opens at the same time that the precharge transistors 15 close, so that the current path between VDD and the first potential V0 is interrupted, even when the switching apparatus 13 and the signal processing apparatus 12 are switched on. The other option is to match the control signal 7 and the precharge signal to one another so as to ensure that the switching transistors in the switching apparatus 13 are open when the precharge transistors 15 are closed.

Figure 5:
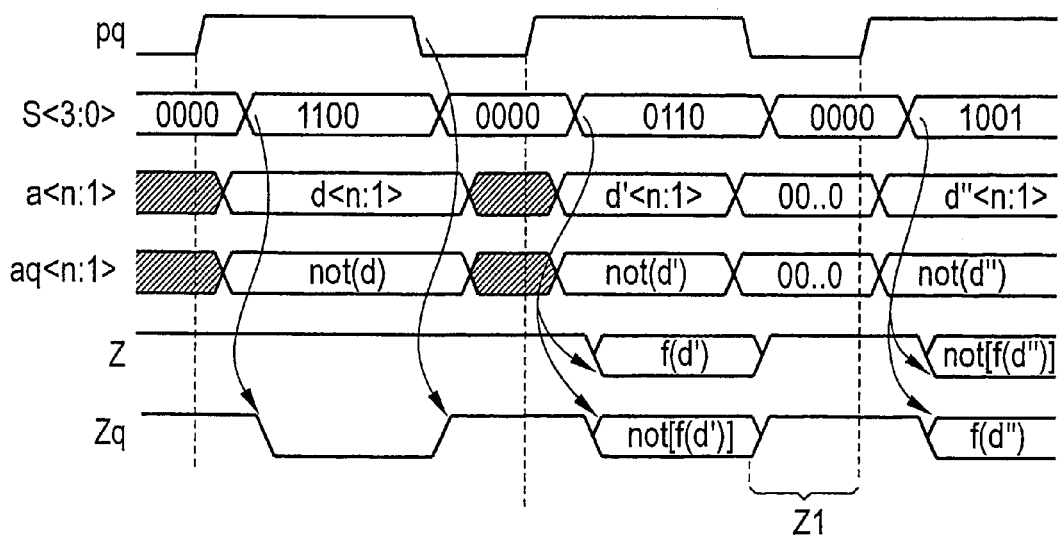
FIG. 5 shows a timing diagram with the signals for the circuit arrangement shown in FIG. 4.

Furthermore, of course, it is possible for the applied data a, aq to be supplied such that s=sq=0, when one of the switches in the switching apparatus 13 is closed and pq=0 at the same time. In order to assist understanding, FIG. 5 shows a signal diagram, which illustrates the time sequence of the signals that occur in the circuit shown in FIG. 4. This shows, by way of example, the time interval Z1. At the start of Z1, pq=0, so that the precharge transistors 15 in FIG. 4 have a low impedance. At the same time, however, the transistors T1 and T2 likewise have a low impedance, corresponding to the control signal s<3:0>=(0110). However, a short circuit between VDD and V0 is prevented because a=aq=0 and hence s=sq=0, until pq once again becomes 1 and the precharge transistors have a high impedance. Two suitable circuits are shown by way of example in FIGS. 6 and 7, and will be described in more detail in the following text.

In addition, FIG. 5 shows the other signal sequences, which have already been described with reference to the circuits in FIGS. 3 and 4, so that the illustration can also be used to assist understanding of these circuits.

The switching apparatus 13 in FIGS. 3 and 4 provides the desired output response with four control bits. Although only four different operating states can be selected, since four transistors are provided, it is advantageous to use four control bits. Alternatively, the drive could be provided by two control bits, which would need to be split by means of an additional circuit in order to drive the four transistors. This results in the following association:

| pq | S<3:0> | z | zq |
|---|---|---|---|
| 1 | 0011 | 0 | 1 |
| 1 | 1100 | 1 | 0 |
| 1 | 0110 | f | Not (f) |
| 1 | 1001 | Not (f) | f |

Only the four values of s as mentioned above may thus be assumed, apart from the precharge state. However, this can be ensured by means of a circuit outside the described data path.

Figure 6:
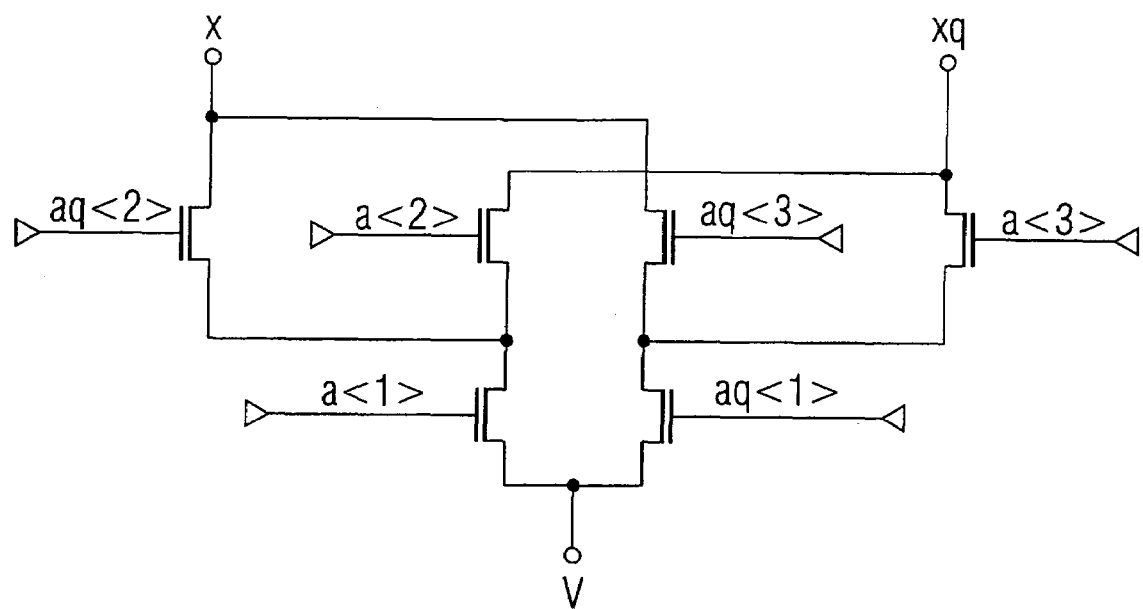
FIG. 6 shows a first exemplary embodiment of a signal processing apparatus.
Figure 7:
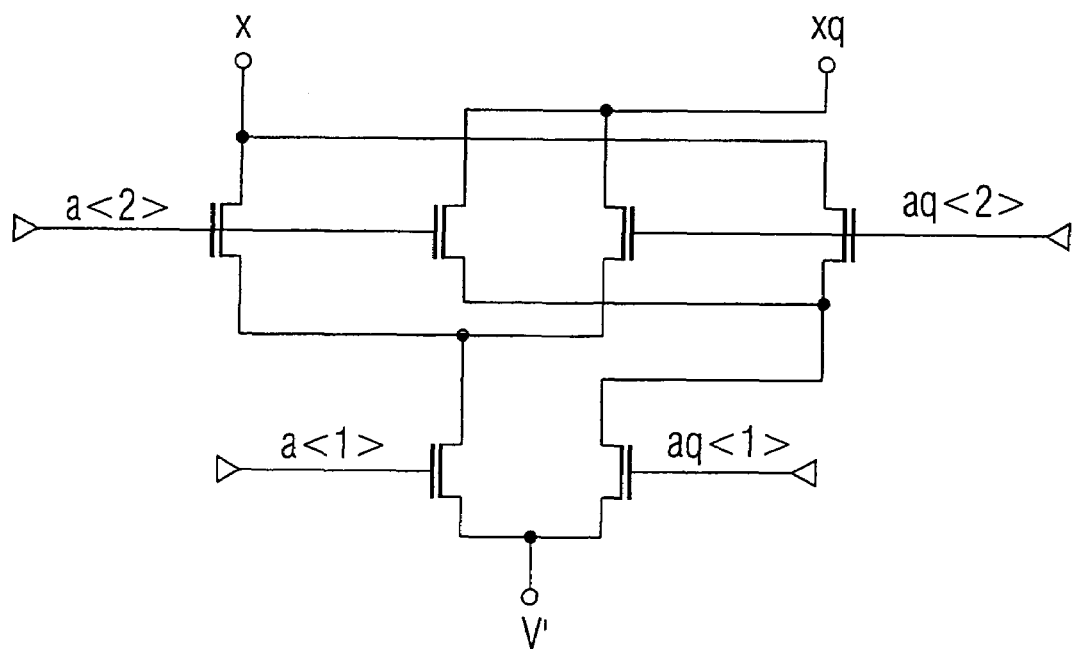
FIG. 7 shows a second exemplary embodiment of a signal processing apparatus.

The signal processing apparatus 12 may provide any desired functions. The simplest case would be: f(a)=a and fq(a)=aq. Depending on whether the received data is or is not scrambled or whether other functions are intended to be provided, any desired circuit may be used in the signal processing apparatus 12. Two examples are illustrated in FIGS. 6 and 7. The circuit in FIG. 6 in this case represents a multiplexer, while the circuit in FIG. 7 provides an XOR gate. Further circuits will be familiar to those skilled in the art, and can be found in the specialist literature.

The circuit shown in FIG. 6 provides the function $$f(a<3:1>)=a<1>\cdot a<2>+\bar{a}<1>\cdot a<3>$$

by means of the functions $$fa<1>\cdot a<2>+aq<1>\cdot a<3> \text{ and}$$

$$fq=a<1>\cdot aq<2>+aq<1>\cdot aq<3>$$

The circuit shown in FIG. 7 provides the function $$f(a<2:1>)=a<1>\oplus a<2>$$

by means of the functions $$f=a<1>\cdot aq<2>+aq<1>\cdot a<2> \text{ and}$$

$$fq=a<1>\cdot a<2>+aq<1>\cdot aq<2>$$

Figure 8:
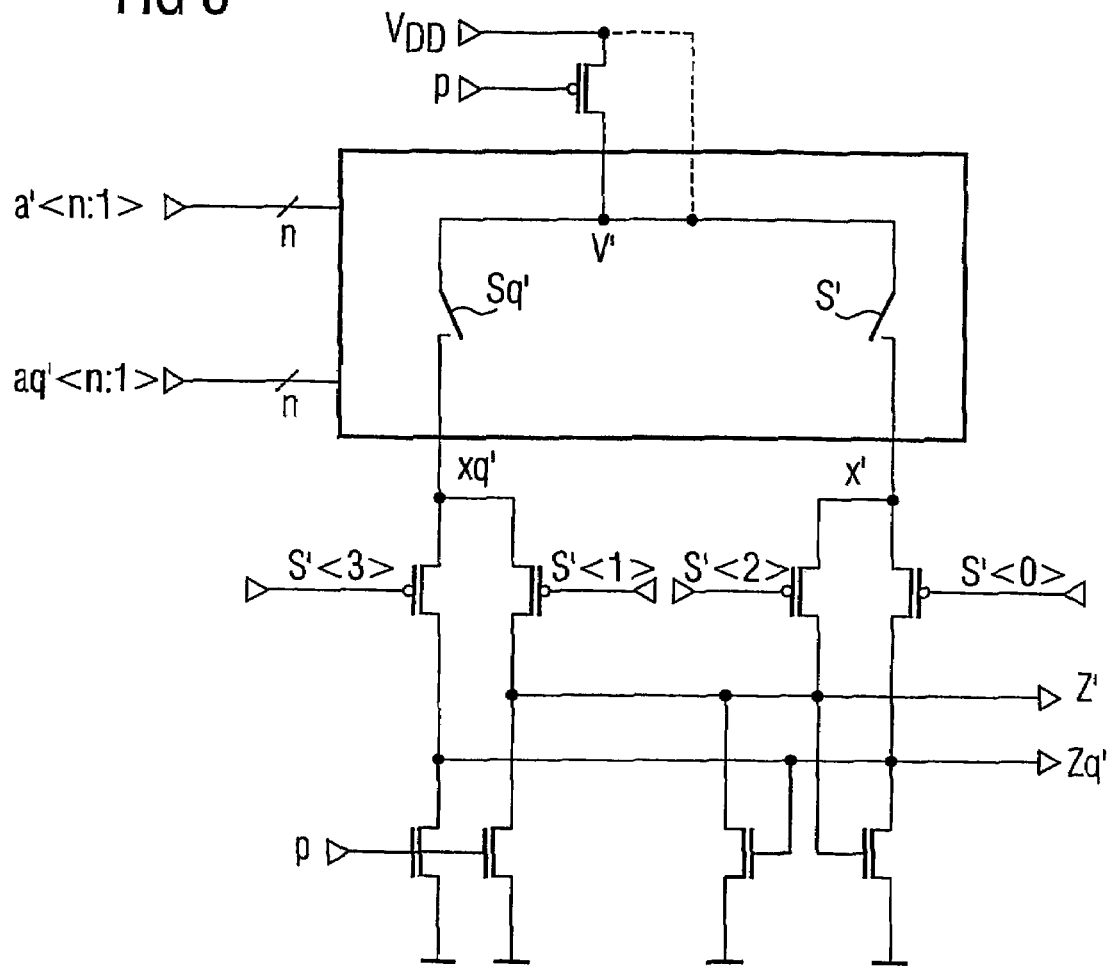
FIG. 8 shows an embodiment of a circuit arrangement according to the invention, as shown in FIG. 3, with p-channel transistors.

FIG. 8 shows a modification of the circuit arrangement shown in FIG. 4. While the circuit in FIG. 4 is formed essentially from n-channel transistors, the configuration of a circuit arrangement as shown in FIG. 8 is formed mainly using p-channel transistors. The rest of the design is symmetrical with respect to the configuration of the circuit shown in FIG. 4. It should be noted that n-channel transistors are used for the precharge transistors 25, however, and are driven by the precharge signal p instead of pq. The foot point transistor 16 to be provided as a function of the drive can likewise be driven by the precharge signal p.

The invention claimed is:

1. A circuit arrangement for producing a dual-rail output signal comprising:
    a first input with at least two connections for receiving a dual-rail input signal;
    a second input for receiving a control signal;
    a signal processing apparatus having a first switch and a second switch, which are each driven as a function of the input signal, and having two outputs, wherein the first output of the signal processing apparatus is connected via one of the switches to a foot point, which is at a first potential, of the signal processing apparatus, and the second output of the signal processing apparatus is connected via the other switch to the foot;
    a switching apparatus, having two inputs, which are connected to the respective outputs of the signal processing apparatus, and two outputs which are connected to two respective outputs of the circuit arrangement in order to output a dual-rail output signal, wherein the outputs of the switching apparatus are each connected to one or both of the inputs of the switching apparatus as a function of the control signal; and
    a potential monitoring apparatus for defining the potentials at the outputs of the circuit arrangement when the outputs of the circuit arrangement are not connected via the switching apparatus and the signal processing apparatus to the foot of the signal processing apparatus.

2. The circuit arrangement as claimed in claim 1, wherein the switching apparatus is designed to allow the following operating situations:
    E1 connected to D1 and E2 connected to D2: z=not (f(a));
    E1 connected to D2 and E2 connected to D1: z=f(a);
    E1 connected to D1 and D2, E2 open: z=0; and
    E2 connected to D1 and D2, E1 open: z=1,
    wherein E1 and E2 are the respective outputs of the switching apparatus, D1 and D2 are the respective inputs of the switching apparatus, z is the dual-rail output signal, and f(a) is a function of the dual-rail input signal.

3. The circuit arrangement as claimed in claim 1, further comprising a precharge apparatus, which is driven by a precharge signal and which produces a predetermined identical potential, before each transmitted data item, at the circuit arrangement outputs which carry data.

4. The circuit arrangement as claimed in claim 1, wherein a third switch driven by the precharge signal is arranged in series with the signal processing apparatus and the switching apparatus, in order to prevent a direct connection between the first potential and the second potential via the first and second switches of the signal processing apparatus and switches of the switching apparatus.

5. The circuit arrangement as claimed in claim 1, wherein the signal processing apparatus contains a switching network via which an XOR function is implemented.

6. A method for producing a dual-rail output signal on first and second associated data lines, comprising the steps of:
    providing a first switch, which is controlled by a first signal f(a, aq), and a second switch, which is controlled by a second signal fq(a, aq), where a, aq is a dual-rail data input signal, wherein fq(a)=not (f(a)) for a valid data signal for which aq=not (a);

connecting the data lines to the first and second switches in one of the following combinations:

the first data line to the first switch and the second data line to the second switch; or the first data line to the second switch and the second data line to the first switch; or the first data line to the first switch and to the second switch and the second data line neither to the first switch nor to the second switch; or the second data line to the first switch and the second switch, and the first data line neither to the first switch nor to the second switch; and wherein, when one of the first and second switches is closed, the data line which is connected to the closed switch is brought to a first potential, and wherein a second potential is associated with the other of the first and second data lines.

* * * * *

UNITED STATES PATENT AND TRADEMARK OFFICE
CERTIFICATE OF CORRECTION

PATENT NO. : 7,323,910 B2
APPLICATION NO. : 10/965663
DATED : January 29, 2008
INVENTOR(S) : Thomas Kunemund et al.

Page 1 of 1

It is certified that error appears in the above-identified patent and that said Letters Patent is hereby corrected as shown below:

In the Specification:

Column 2, line 67, "z=not($s1 \cdot$not($f$(a<n:1>)=$s0 \cdot f$(a<n:1>))" should read -- z=not($s1 \cdot$not($f$(a<n:1>))=$s0 \cdot f$(a<n:1>))--

Column 6, line 35, "s<1>and s<0>." Should read --s<1> and s<0>.--

Column 7, line 50, "$f$a" should read --$f$=a--

Signed and Sealed this

Third Day of June, 2008

JON W. DUDAS
*Director of the United States Patent and Trademark Office*